United States Patent [19]

Bazes

[11] Patent Number: 5,644,262
[45] Date of Patent: Jul. 1, 1997

[54] DIGITALLY CONTROLLED CAPACITIVE LOAD

[75] Inventor: Mel Bazes, Haifa, Israel

[73] Assignee: Intel Corporation, Santa Clara, Calif.

[21] Appl. No.: 621,732

[22] Filed: Mar. 21, 1996

Related U.S. Application Data

[63] Continuation of Ser. No. 394,677, Feb. 24, 1995, abandoned.

[51] Int. Cl.$^6$ ............................. H03K 5/13; H03K 17/28
[52] U.S. Cl. ........................... 327/277; 327/264; 327/288
[58] Field of Search ................................ 327/276, 277,
327/278, 281, 284, 285, 288, 263, 264,
261, 392, 393, 394, 337, 270, 271

[56] References Cited

U.S. PATENT DOCUMENTS

| | | | |
|---|---|---|---|
| 3,745,383 | 7/1973 | Sangster | 327/284 |
| 4,837,466 | 6/1989 | Kanauchi | 327/284 |
| 4,975,605 | 12/1990 | Bazes | 307/606 |
| 4,994,695 | 2/1991 | Bazes | 307/602 |
| 5,012,142 | 4/1991 | Sonntag | 327/281 |
| 5,051,629 | 9/1991 | Hopkins | 327/263 |
| 5,130,564 | 7/1992 | Sin | 327/264 |
| 5,258,659 | 11/1993 | Kannegundla | 327/263 |
| 5,283,631 | 2/1994 | Koerner et al. | 327/393 |
| 5,365,128 | 11/1994 | Bazes | 327/141 |
| 5,416,436 | 5/1995 | Rainard | 327/278 |

FOREIGN PATENT DOCUMENTS

| | | | |
|---|---|---|---|
| 4207521 | 7/1992 | Japan | 327/285 |
| 4354141 | 12/1992 | Japan | 327/284 |

OTHER PUBLICATIONS

"A Novel CMOS Digital Clock and Data Decoder", Mel Bazes & Roni Ashuri, *IEEE Journal of Solid-State Circuits*, vol. 27, No. 12, Dec. 1992, pp. 1934-1940.

*Primary Examiner*—Timothy P. Callahan
*Assistant Examiner*—Eunja Shin
*Attorney, Agent, or Firm*—Blakely, Sokoloff, Taylor & Zafman

[57] ABSTRACT

An integrated circuit for selectively providing delay to a waveform carried on a signal line. With the present invention, a waveform is carried by a signal line to which a digitally-controlled capacitive load is coupled. A digital enable line is directly coupled to the capacitive load which either activates or deactivates the capacitive load. When the enable line is in the active state, the capacitive load is activated and the load therefore has maximum capacitance. Accordingly, the delay of the waveform carried on the signal line is also maximized. When the enable line is in the inactive state, the capacitive load has minimal capacitance and the delay of the signal being carried on the signal line is therefore minimized.

16 Claims, 1 Drawing Sheet

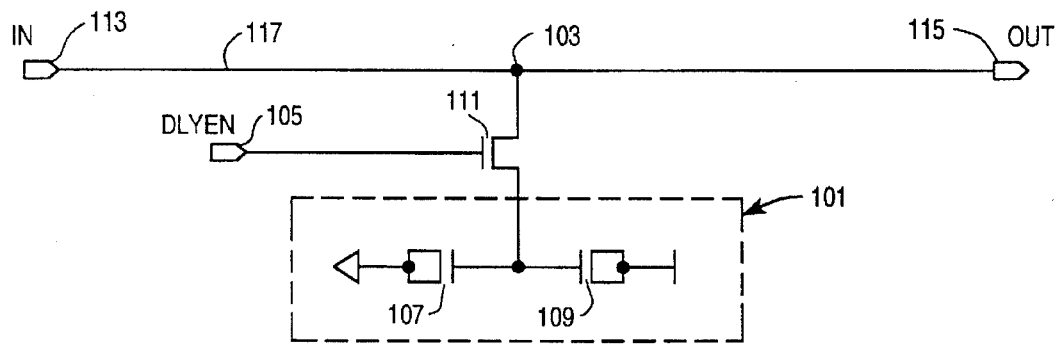
FIG_1 (PRIOR ART)
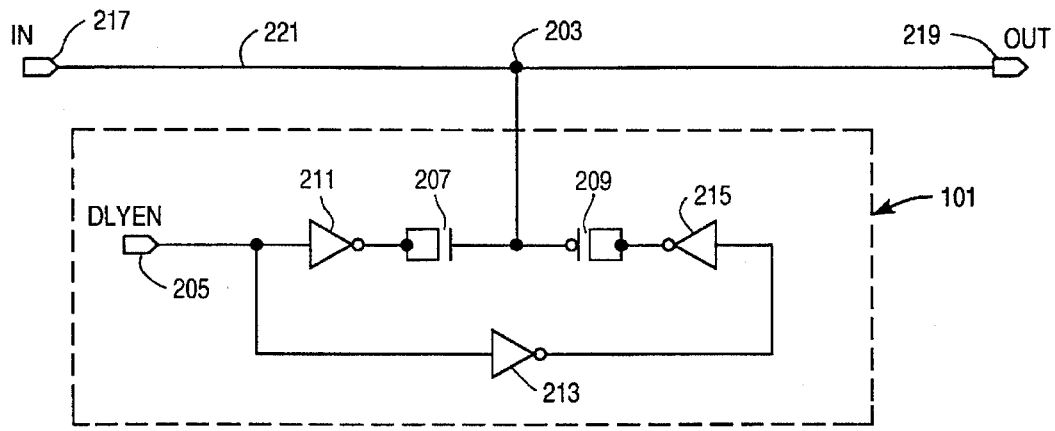
FIG_2
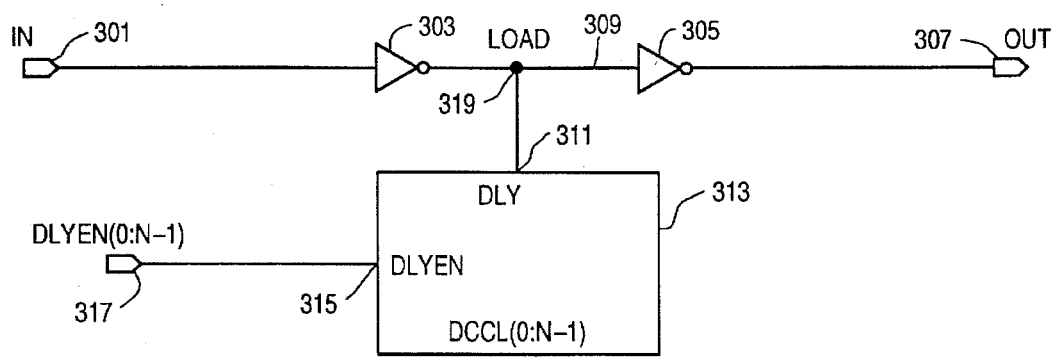
FIG_3

DIGITALLY CONTROLLED CAPACITIVE LOAD

This is a continuation of application Ser. No. 08/394,677 filed Feb. 24, 1995, now abandoned.

I. BACKGROUND OF THE INVENTION

A. Field of the Invention

This invention relates to digital waveform processing and, more particularly, to the deskewing and delaying of a waveform under digital control.

B. Description of the Prior Art

Digitally-controlled capacitive devices may serve a number of uses which include being used as digitally-controlled delays in clock generator circuits. The digitally-controlled delays are necessary in such circuits for precision deskewing of output waveforms. Circuit implementations of the digitally controlled delays have generally involved attaching a capacitive load to a signal line with a transmission gate coupled between the capacitive load and the signal line. The signal line carries the waveform to be delayed and the transmission gate acts as a digital switch to selectively connect or disconnect the capacitive load to the signal line. When the capacitive load is connected to the signal line, the waveform carried by the signal line is correspondingly delayed. Conversely, when the capacitive load is disconnected from the signal line, the waveform carried by the signal line is not delayed.

Prior art implementations of digitally-controlled capacitive loads suffer from the problems associated with the transmission gate used as a switch to connect and disconnect the capacitive load to the signal line. In general, the prior art transmission gate itself adds a significant amount of capacitance to the signal line, even when the gate is switched off. Moreover, the prior art transmission gate is known to cause glitches on the signal line each time the gate is switched. Considering objectionable characteristics in the prior art digitally-controlled capacitive loads, an improved digitally-controlled capacitive load is desired.

II. SUMMARY OF THE INVENTION

An integrated circuit for selectively providing delay to a waveform carried on a signal line is described. With the present invention, a digitally-controlled capacitive load is coupled to the signal line which carries the waveform. An enable line is directly coupled to the capacitive load so as to selectively activate and deactivate the capacitive load. When the enable line is in an active state, the capacitive load has maximum capacitance and the delay of the waveform being carried on the signal line is correspondingly maximized. When the enable line is in an inactive state, the capacitive load has minimum capacitance and the delay of the waveform being carried on the signal line is minimized accordingly.

III. BRIEF DESCRIPTION OF THE DRAWINGS

FIG. 1 is a schematic of a prior art digitally-controlled capacitive load.

FIG. 2 is a schematic of the presently preferred embodiment of an improved digitally-controlled capacitive load.

FIG. 3 is block diagram of an embodiment using N of the presently preferred digitally-controlled capacitive loads to variably delay a waveform being carried by the signal line.

IV. DETAILED DESCRIPTION

An integrated circuit for selectively providing delay to a waveform carried on a signal line is described. In the following description, numerous specific details are set forth such as specific circuits in order to provide a thorough understanding of the present invention. The present invention, however, may be practiced without these specific details. In other instances, the details of well-known circuitry are not shown here in order not to obscure the present invention unnecessarily. In the following description, the presently preferred embodiment is used as part of a delay interpolator. The invention may also be used, however, in other similarly configured circuits.

FIG. 1 is a schematic of a prior art digitally-controlled capacitive load 101. Capacitive load 101 is coupled to signal line 117 at node 103 through transmission gate 111. Signal line 117 carries a waveform which enters signal line 117 at IN 113 and is output at OUT 115. Transmission gate 111 selectively connects and disconnects capacitive load 101 to signal line 117 in response to DLYEN 105. Capacitive load 101 is comprised of a p-type MOS transistor 109 and an n-type MOS transistor 107. Transistors 107 and 109 have commonly connected gates. The drain and source of transistor 107 are both coupled to $V_{ss}$ and the drain and source of transistor 109 are both coupled to $V_{cc}$.

Operation of prior art digitally-controlled capacitive load 101 is simple. When DLYEN 105 is high, transmission gate 111 conducts and connects capacitive load 101 to signal line 117 at node 103. When DLYEN 105 is low, transmission gate 111 is cut-off and capacitive load 101 is disconnected from signal line 117 accordingly.

One of the problems associated with prior art capacitive load 101 shown in FIG. 1 is that transmission gate 111 itself adds a significant amount of capacitance to signal line 117, even when DLYEN 105 is inactive. The added capacitance is an effect produced by the drain-diffusion capacitance of transmission gate 111. As a result of this additional capacitance, the number of prior art digitally-controlled capacitive loads 101 that can be coupled to signal line 117 is limited to a relatively low value because of the reliability problems created by excessive loading of signal line 117.

An additional problem associated with prior art digitally-controlled capacitive load 101 is realized during DLYEN 105 transitions from active to inactive, and vice-versa. Particularly, when DLYEN 105 changes states, a small glitch appears at node 103 on signal line 117. The glitch is an effect of the capacitive coupling from DLYEN 105 to node 103. As a result, a large number of prior art digitally-controlled capacitive loads 101 cannot be connected to a signal line 117. If all of the large number of capacitive loads 101 were enabled or disabled simultaneously, the resulting glitch amplitude on signal line 117 could become prohibitively excessive.

FIG. 2 is a schematic of the presently preferred embodiment of a digitally-controlled capacitive load 201. Capacitive load 201 is coupled to signal line 221 at node 203. Signal line 221 carries a waveform which enters signal line 221 at IN 217 and is output at OUT 219. Capacitive load 201 includes n-type MOS transistor 207 and p-type MOS transistor 209, transistors 207 and 209 having commonly connected gates that are directly coupled to node 203. The source and drain of n-type MOS transistor 207 are coupled to the output of logical-NOT gate 211. Similarly, the source and drain of p-type MOS transistor 209 are coupled to the output of logical-NOT gate 215. DLYEN 205 is directly coupled to the input of logical-NOT gate 211 and DLYEN 205 is coupled to the input of logical-NOT gate 215 through logical-NOT gate 213.

When DLYEN 205 is low, the source and drain of n-type MOS transistor 207 are at $V_{cc}$, while the source and drain of p-type MOS transistor 209 are at $V_{ss}$. In this condition, both transistors 207 and 209 are cut-off. In the cut-off condition, there is no inversion layer in transistors 207 and 209. This absence of an inversion layer effectively lowers the gate capacitances of the respective transistors 207 and 209 to a very low minimal value.

The absence of inversion layers which minimize the capacitances of transistors 207 and 209 can be understood by considering an inversion layer as one of the two plates of a capacitor. The other one of the two plates is the gate of the transistor. The absence of an inversion layer is equivalent to separating the capacitor plates by a large amount. Thus, the absence of an inversion layer correspondingly reduces the capacitance of each transistor 207 and 209 to a minimal value.

Conversely, when DLYEN 205 is high, inversion layers are created in transistors 207 and 209. Accordingly, the capacitances in transistors 207 and 209 are maximized. In the presently preferred embodiment, maximum capacitance is achieved as long as the gate voltage is one threshold voltage above $V_{ss}$ in the n-type MOS transistor 207, and the gate voltage is one threshold voltage below $V_{cc}$ in the p-type MOS transistor 209.

Thus, by having the gates of transistors 207 and 209 directly coupled to signal line 221 at node 203, the presently preferred capacitive load 201 solves the problems associated with prior art capacitive load 101. There is no need in the presently preferred embodiment for a gate corresponding with the prior art intermediating transmission gate 111. As a result, the presently preferred embodiment does not suffer from the problems associated with transmission gate 111. When DLYEN 205 is low, the capacitive loading on node 203 is very low, when compared with prior art capacitive load 101, since there is no undesirable drain diffusion connected to signal line 221 by presently preferred capacitive load 201. Hence, a greater number of presently preferred capacitive loads 201 can be reliably connected to a signal line 221. When DLYEN 205 switches, no significant glitching occurs since the capacitor associated with each transistor 207 and 209 switches in the opposite direction of the other and effectively cancels out the glitch caused by the other. In the presently preferred embodiment, transistors 207 and 209 have the same gate dimensions in order to ensure the glitch canceling characteristics of the transistors 207 and 209 during DLYEN 205 transitions.

FIG. 3 illustrates an alternative embodiment utilizing the present invention. In the FIG. 3, N of the presently preferred capacitive loads 313 are coupled to signal line 309 at node LOAD 319 through node DLY 311. A waveform enters signal line 309 through IN 301 and gate 303. The waveform is output from signal line 309 at LOAD 319 through gate 305 and OUT 307. Each of the N capacitive loads 313 can be individually enabled under control of the signals carried by DLYEN <0:N−1> line 317 which is coupled to the N capacitive loads 313 at DLYEN terminal 315. With the embodiment illustrated in FIG. 3, the waveform on signal line 309 at LOAD 319 can be variably delayed in response to the control signals carried by DLYEN<0:N−1>317. For minimal delay between IN 301 and OUT 307, none of the N capacitive loads 313 are enabled. For maximum delay between IN 301 and OUT 307, all of the N capacitive loads 313 are enabled. The delay between IN 301 and OUT 307 can be computed using the following linear equation:

$$t_{DLY}(n) = t_{DLY}(0) + n \cdot t_{UNITDLY} \quad \text{(Equation 1)}$$

where n is the number of signals active in DLYEN<0:N−1>317, $t_{DLY}(n)$ is the delay between IN 301 and OUT 307 with n of the signals active in DLYEN<0:N−1>317, $t_{DLY}(0)$ is the delay between IN 301 and OUT 307 with none of the signals active in DLYEN<0:N−1>317, and $t_{UNITDLY}$ is the delay between IN 301 and OUT 307 with a single one of the capacitive loads activated in capacitive loads 313.

Test simulations have been run modeling the N capacitive loads 313 illustrated in FIG. 3. In the simulations, when the N capacitive loads 313 were incorporated using presently preferred digitally-controlled capacitive loads 201, the linear relationship set forth in Equation 1 was followed extremely well. On the other hand, when prior art digitally-controlled capacitive loads 101 were used in simulation, the resulting circuit deviated significantly from the linear relationship set forth in Equation 1. Thus, the presently preferred embodiment of capacitive load 201 is particularly well suited for the application embodied in FIG. 3, and the prior art capacitive load 101 is unacceptable.

The embodiment described in FIG. 3 using N digitally-controlled capacitive loads 313 is also utilized with the circuitry described in pending patent application, Ser. No. 08/394,174, filed on Feb. 24, 1995, and entitled "DELAY INTERPOLATION CIRCUITRY now U.S. Pat. No. 5,489,864."

Thus, an improved digitally-controlled capacitive circuit is described. The described digitally-controlled capacitive circuit provides a digitally-controlled delay without the detrimental characteristics and non-linear behavior of the prior art digitally-controlled capacitive delay. Although the present invention has been described in terms of a preferred embodiment, it will be appreciated that various modifications and alterations might be made by those skilled in the art without departing from the spirit and scope of the present invention.

I claim:

1. An integrated circuit for providing a variable delay for a waveform carried by a signal line, the integrated circuit coupled to the signal line, the integrated circuit comprising:

a delay enable line having an active state and an inactive state; and a capacitive load directly coupled to the signal line, the capacitive load comprising first and second transistors having commonly connected gates directly coupled to the signal line, the delay enable line coupled to the first and second transistors, the capacitive load having minimum capacitance when the delay enable line is in the inactive state, the capacitive load having maximum capacitance when the delay enable line is in the active state, the first and second transistors configured to switch in opposite directions in response to a transition on the delay enable line.

2. The integrated circuit defined in claim 1, wherein the first transistor comprises an n-type MOS transistor and the second transistor comprises a p-type MOS transistor.

3. The integrated circuit defined in claim 2, wherein the source and drain of the n-type MOS transistor are both connected to a high voltage level when the delay enable line is inactive and to a low voltage level when the delay enable line is active.

4. The integrated circuit defined in claim 3, wherein the source and drain of the p-type MOS transistor are both connected to a low voltage level when the delay enable line is inactive and to a high voltage level when the delay enable line is active.

5. The integrated circuit defined in claim 4, wherein the low voltage level is ground.

6. The integrated circuit defined in claim 5, wherein the high voltage level is $V_{cc}$.

7. The integrated circuit defined in claim 6, wherein the capacitive load further comprises a first logic gate, a second logic gate, and a third logic gate, the first logic gate being coupled to the delay enable line and the source and drain of the n-type MOS transistor, the second logic gate being coupled to the source and drain of the p-type MOS transistor, and the third logic gate being coupled to the second logic gate and the delay enable line.

8. The integrated circuit defined in claim 7, wherein the first logic gate, the second logic gate, and the third logic gates are logical-NOT gates.

9. The integrated circuit described in claim 1 wherein a first glitch associated with the first transistor on the signal line is canceled by a second glitch associated with the second transistor on the signal line during the transition on the delay enable line.

10. The integrated circuit described in claim 1 wherein a gate of the first transistor has dimensions substantially equal to a gate of the second transistor.

11. A method for providing a variable delay for a waveform carried by a signal line comprising the steps of:

loading the signal line with first and second capacitive loads in response to a delay enable line;

switching the first and second capacitive loads in opposite directions; and canceling a first glitch on the signal line generated by the first capacitive load during a transition on the delay enable line with a second glitch on the signal line generated by the second capacitive load during the transition on the delay enable line.

12. The method described in claim 11 wherein the first and second capacitive loads are first and second transistors having commonly coupled gates, wherein a drain and a source of the first transistor and a drain and a source of the second transistor are coupled to the delay enable line.

13. The method described in claim 12 wherein the gate of the first transistor has dimensions substantially equal to the gate of the second transistor.

14. The method described in claim 12 wherein the loading step includes the steps of coupling the drain and source of the first transistor to a first voltage in response to the delay enable line and coupling the drain and source of the second transistor to a second voltage in response to the delay enable line.

15. The method described in claim 13 wherein the first transistor is an n-type MOS transistor and the second transistor is a p-type MOS transistor.

16. The method described in claim 14 wherein the first voltage is ground and the second voltage is $V_{cc}$.

* * * * *